(12) United States Patent
Harada et al.

(10) Patent No.: US 6,202,653 B1
(45) Date of Patent: Mar. 20, 2001

(54) PROCESSING SOLUTION SUPPLYING APPARATUS, PROCESSING APPARATUS AND PROCESSING METHOD

(75) Inventors: Koji Harada, Kikuchi-gun; Fumihiko Kawano, Hachioji, both of (JP)

(73) Assignee: Tokyo Electron Ltd. (JP)

( * ) Notice: Subject to any disclaimer, the term of this patent is extended or adjusted under 35 U.S.C. 154(b) by 0 days.

(21) Appl. No.: 09/270,805

(22) Filed: Mar. 17, 1999

(30) Foreign Application Priority Data

Mar. 18, 1998 (JP) .................................................. 10-090761

(51) Int. Cl.[7] ....................................................... B08B 9/02
(52) U.S. Cl. ..................................... 134/22.11; 134/22.12; 134/37; 118/715; 118/726
(58) Field of Search ............................. 134/22.11, 22.12, 134/22.18, 37; 118/715, 726

(56) References Cited

U.S. PATENT DOCUMENTS

| | | | |
|---|---|---|---|
| 5,401,316 | 3/1995 | Shiraishi et al. | 118/689 |
| 5,690,743 | * 11/1997 | Murakami et al. | 118/715 |

* cited by examiner

*Primary Examiner*—Randy Gulakowski
*Assistant Examiner*—Saeed T. Chaudhry
(74) *Attorney, Agent, or Firm*—Rader, Fishman, & Grauer

(57) ABSTRACT

In this processing solution supplying apparatus, when restarting the hydrophobic process, the air in the supply pipe is exhausted outside before performing the hydrophobic process by using a transfer gas, bypassing the process chamber. Thus, a large-sized mist of HMDS staying inside the supply pipe is not supplied to the wafer as it is, and after restarting the hydrophobic process after a prolonged stoppage of the adhesion apparatus, the vapor or mist of HMDS can be supplied uniformly to the wafer.

10 Claims, 6 Drawing Sheets

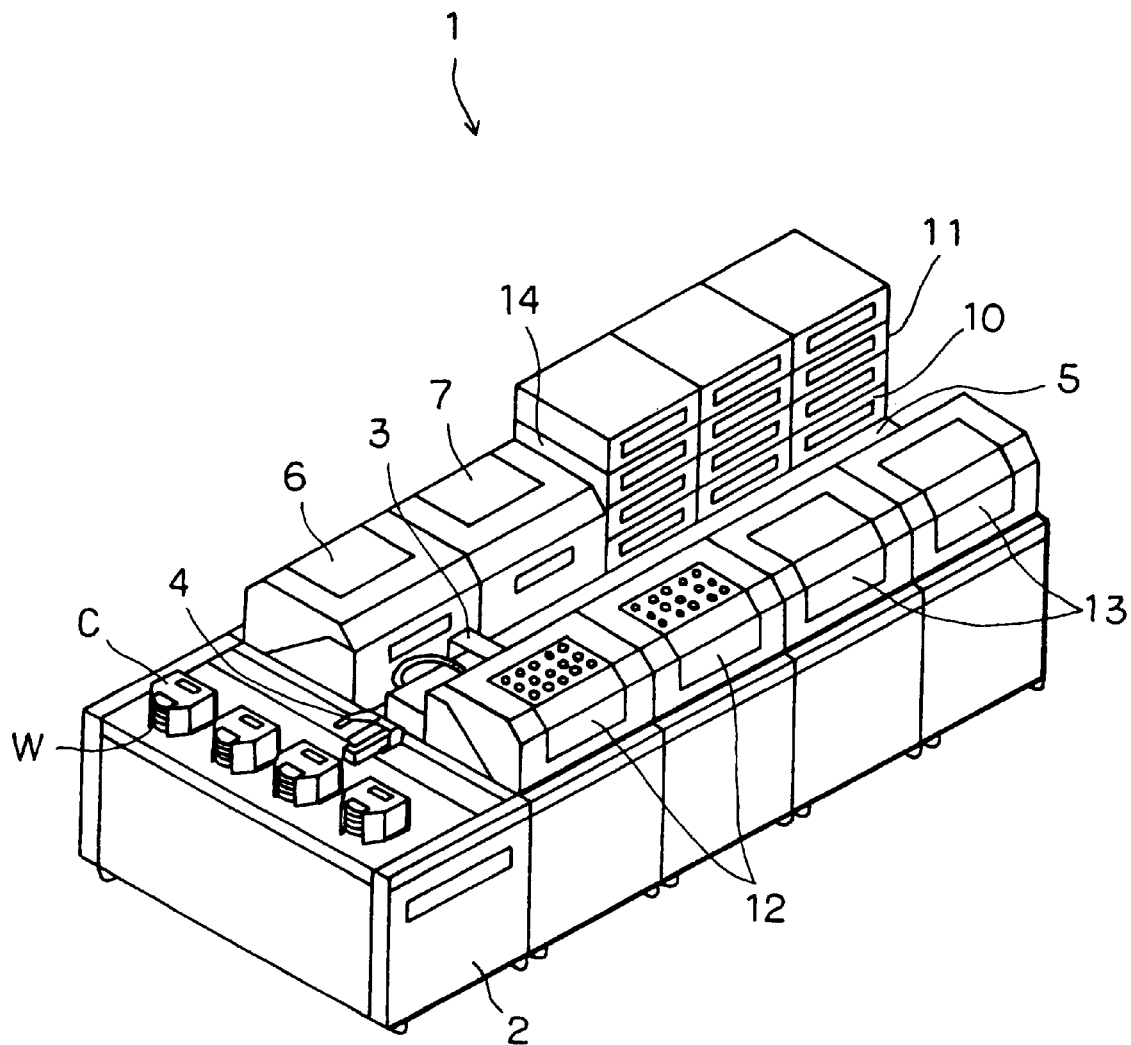
F I G. 1

| | |
|---|---|
| VALVE 42 ———————— | VALVE 42 ——⌐———— |
| VALVE 37 ——⌐———— | VALVE 37 ———————— |
| VALVE 36 ———————— | VALVE 36 ———————— |
| VALVE 39 ——⌐———— | VALVE 39 ———————— |
| VALVE 38 ——⌐———— | VALVE 38 ——⌐———— |
| VALVE 43 ——⌐———— | VALVE 43 ———————— |
| VALVE 45 ———————— | VALVE 45 ——⌐———— |
| VALVE 22 ——⌐———— | VALVE 22 ———————— |
| VALVE 24 ——⌐———— | VALVE 24 ——⌐———— |
|  SUPPLY POINT |  BY-PASS POINT |

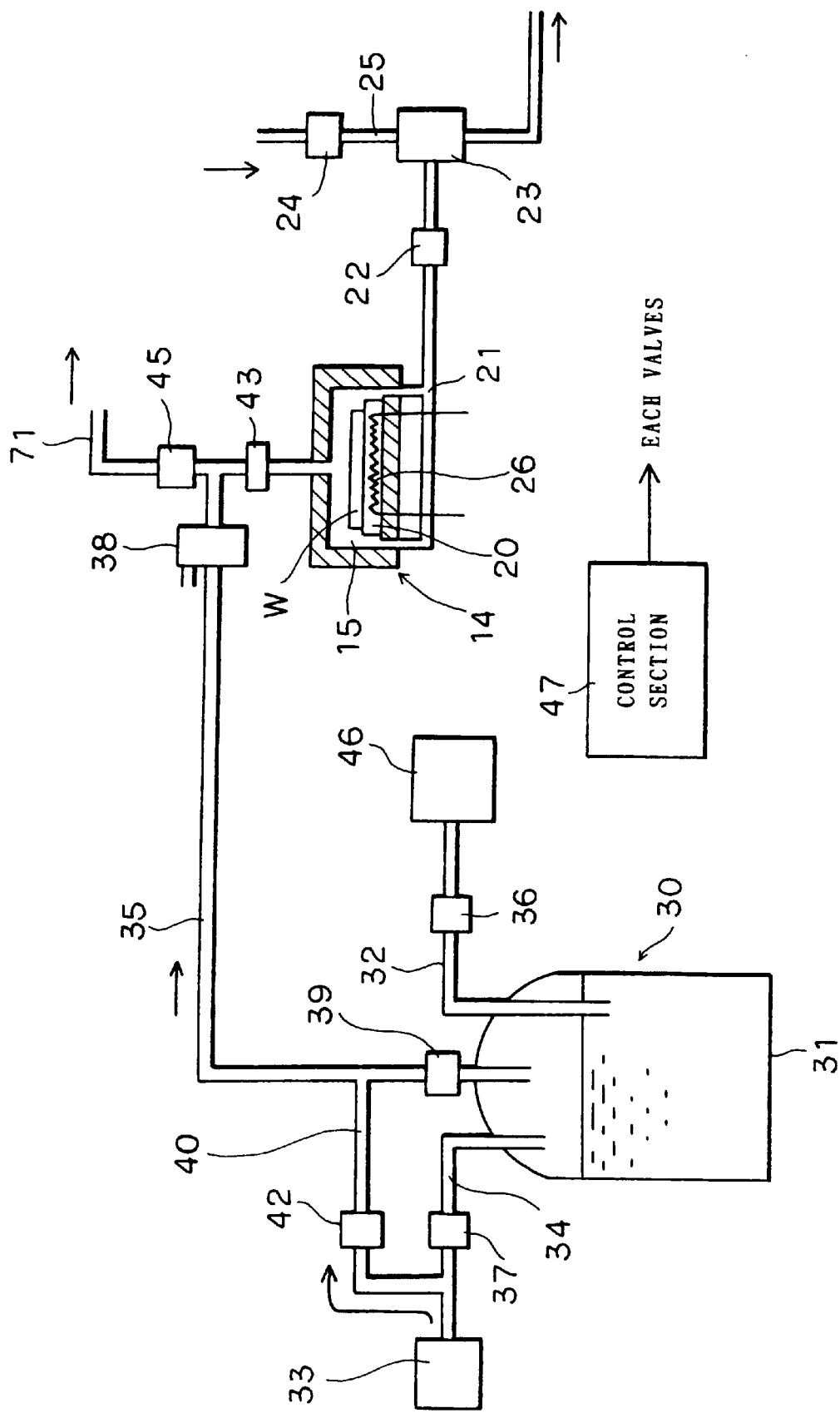
F I G. 7

PROCESSING SOLUTION SUPPLYING APPARATUS, PROCESSING APPARATUS AND PROCESSING METHOD

BACKGROUND OF THE INVENTION

1. Field of the Invention

The present invention relates to a processing solution supplying apparatus, processing apparatus and method, which supply a vapor or mist of a processing solution to a substrate, for example.

2. Description of the Related Art

In the photoresist process of manufacturing a semiconductor apparatus, a processing solution supplying apparatus is used, which supplies processing solution to the substrate such as a semiconductor wafer (hereafter called "wafer"). Meanwhile, in a hydrophobic process to improve the fixation between a wafer and a resist, hexamethyldisilzane (hereafter called "HMDS") is used as a processing solution.

To perform this hydrophobic process uniformly, HMDS must be supplied uniformly to the wafer. Therefore conventionally, a solution HMDS is first changed into a vapor or mist form, and then supplied through a pipe to the wafer in a process chamber with a transfer gas such as nitrogen.

SUMMARY OF THE INVENTION

However, in case the processing solution supplying apparatus itself stops working for a long time for reasons such as emergency stop, the vapor or mist of HMDS is kept ins the pipe. Consequently the size of the HMDS vapor or mist grows large with time.

When the hydrophobic process of a wafer is resumed under such condition, this large-sized mist will be supplied to the wafer in the process chamber. As a result, the HMDS vapor or mist may not be supplied uniformly to the wafer's surface.

An object of the present invention is to provide a processing solution supplying apparatus, a processing apparatus and method which enable an uniform supply of vapor or mist of a processing solution to a substrate, even when restarting the process after a prolonged stoppage of the processing solution supplying apparatus.

To solve the above-described problem, a first aspect of the present invention is an apparatus for supplying a gas including a processing solution to a process chamber, the process chamber performing a predetermined process to an object to be processed, the apparatus comprising an output section outputting the gas including the processing solution, a supply pipe disposed between the output section and the processing chamber and supplying the output gas to the processing chamber, and cleaning means for causing a cleaning gas to pass through the supply pipe and discharging the cleaning gas just before the process chamber.

A second aspect of the present invention is a processing apparatus comprising a process chamber performing the predetermined process to an object to be processed using a gas including a processing solution, an output section for outputting gas including a processing solution, a supply pipe disposed between the output section and the process chamber for supplying the exhaust gas to the process chamber, and cleaning means for causing the cleaning gas to pass through the supply pipe and discharging the gas just before the process chamber.

A third aspect of the present invention is an apparatus which supplies a gas including a processing solution to a process chamber for performing a predetermined process to an object to be processed, comprising, a source outputting a transfer gas, a tank storing the processing solution, taking in the transfer gas output from the source, and sending out the transfer gas including the processing solution, a supply pipe disposed between the tank and the process chamber, supplying the transfer gas including the processing solution to the process chamber, a bypass pipe connecting the transfer gas supply source with the supply pipe, a first valve disposed between the transfer gas supply source and the tank, a second valve disposed between the tank and the supply pipe, a third valve disposed at the bypass pipe, exhaustion means disposed between the supply pipe and the process chamber and for exhausting the transfer gas passing through the supply pipe at the time of cleaning just before the process chamber, and a control section opening the first and second valves and closing the third valve at the time of performing the predetermined process to the object to be processed, and closing the first and second valves and opening the third valve at the time of cleaning.

A fourth aspect of the present invention is a processing method comprising the steps of, (a) supplying a gas including a processing solution to a process chamber through a supply pipe, (b) performing a predetermined process to an object to be processed in the process chamber using the gas including the processing solution, and (c) causing a cleaning gas to pass through the supply pipe and exhausting the cleaning gas just before the process chamber.

In the present invention, when a large-sized mist exists inside the pipe, this mist can be exhausted without sending it to the process chamber. Therefore, when restarting the process after stopping the processing solution supplying apparatus for a long time, it is possible to supply the processing solution uniformly to the substrate.

These purpose and other purpose and benefits of the present invention can easily be defined with the following explanations and drawings.

BRIEF DESCRIPTION OF DRAWINGS

FIG. 1 is an perspective view showing the outside of a coating development processing apparatus according to the embodiment of the present invention;

FIG. 7 is an explanatory view showing the composition of a processing solution supplying apparatus according to the another embodiment of the present invention.

DETAILED DESCRIPTION OF THE PREFERRED EMBODIMENT

Figure 2:
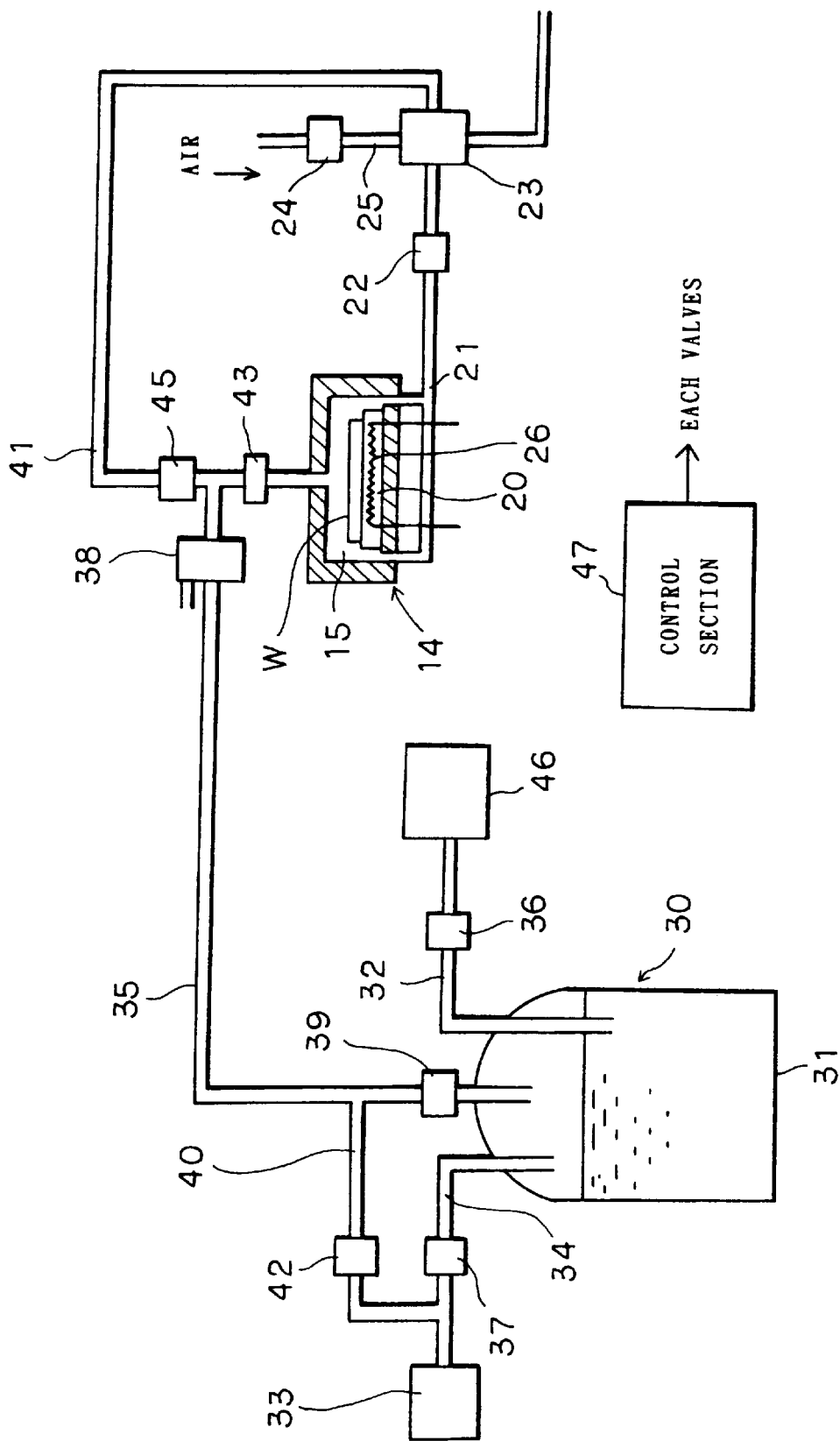
FIG. 2 is an explanatory view showing the composition of a processing solution supplying apparatus according to the embodiment of this invention.

As shown in FIG. 1, a coating development apparatus 1 performs successive photolithography processes applied to a wafer W. A cassette station 2 is disposed at the end of this coating development apparatus 1. A plurality of cassettes C storing wafers W in units of 25, for example, can be mounted on the cassette station 2. A main transfer apparatus 3 which transfers and positions a wafer W and a transfer unit 4 which transfers a wafer W to the main transfer apparatus 3 are disposed at the front of a cassette C (the transfer exit side of a wafer W). Several types of processing apparatus performing the predetermined process to a wafer W are disposed at both sides of a transfer path 5 of the main transfer apparatus 3.

Namely, a brush scrubber 6 for washing the wafer W taken out of the cassette C, a wafer washer 7 for washing the wafer W with a high-pressure jet, a cooling apparatus 10 for cooling the wafer W to the predetermined temperature, a heat processing apparatus 11 for heating the wafer W, a resist coater 12 for coating the rotating wafer W with a resist film, a developing apparatus 13 for applying the predetermined developing process to the wafer W, and an adhesion apparatus 14 for applying a hydrophobic process to the wafer W are disposed at either side of the transfer path 5.

As shown in FIG. 2, in the adhesion apparatus 14 there is a mounting table 20 which includes a heating unit 26 for heating a wafer W in a process chamber 15. The bottom of the process chamber 15 is connected to an exhaustion pipe 21 which exhaustes air in the chamber 15. An ejector (an air pressurised evacuating apparatus) 23 is connected to this exhaustion pipe 21 through a valve 22. The ejector 23 is connected to a driving air supply pipe 25 through a valve 24. The driving air supply pipe 25 supplies pressured air as a driving force. Therefore, the air in the process chamber 15 is evacuated by supplying pressured air to the ejector 23 through the driving air supply pipe 25.

A processing solution supplying apparatus 30 has a tank 31 which stores the HMDS solution. Three supply pipes are connected to the top of the tank 31. They are; 1) a processing solution supply pipe 32 which supplies HMDS solution from its supply source 46 to the tank 31, 2) a transfer gas supply pipe 34 which supplies a transfer gas such as nitrogen gas supplied from its supply source 33 to the tank 31, and 3) a supply pipe 35 which supplies the vapor or mist of HMDS solution gasified in the tank 31.

A processing solution supply pipe 32 is equipped with a valve 36, a transfer gas supply pipe 34 is equipped with a valve 37, and a supply pipe 35 is equipped with valves 38 and 39. The valve 38 is for connecting and switching the supply pipe 35 to a suction system.

Arranged in the transfer gas supply pipe 34 is a branched supply pipe 40 connected to a supply pipe 35 bypassing the tank 31. A branched exhaustion pipe 41 bypassing the process chamber 15 is disposed between the ejector 23 and the supply pipe 35. The branched supply pipe 40 is equipped with a valve 42, the branched exhaust pipe 41 with a valve 45.

A control section 47 controls the opening and closing of each valves 22, 24, 36, 37, 38, 39, 42, 43, and 45.

Next, the operation of the above-described processing solution supplying apparatus 30 will be described.

Figure 3:
FIG. 3 is a timing chart showing the open/close state of each valve when supplying processing solution.
Figure 4:
FIG. 4 is a timing chart showing the open/close state of each valve when bypassing.

FIG. 3 shows the open/close state of the valves when supplying processing solution, and FIG. 4 shows their open/close state when bypassing.

As shown in FIG. 3, when a wafer W is mounted on a table 20 of an adhesion apparatus 14 by the main transfer apparatus 3, valves 22 and 24 open and driving pressured air is sent to the ejector 23 through a driving air supply pipe 25. And then, air in the process chamber 15 is vacuumed and exhausted by the ejector 23 and the chamber 15 is depressured.

While evacuating in the process chamber 15 with the ejector 23, a valve 37 opens and the transfer gas is supplied from its supply source 33 into the tank 31 through a transfer gas supply pipe 34. Moreover by adjusting the opening of a valve 37 in the transfer gas supply pipe 34, the amount of transfer gas flowing into the tank 31 can be adjusted.

Figure 5:
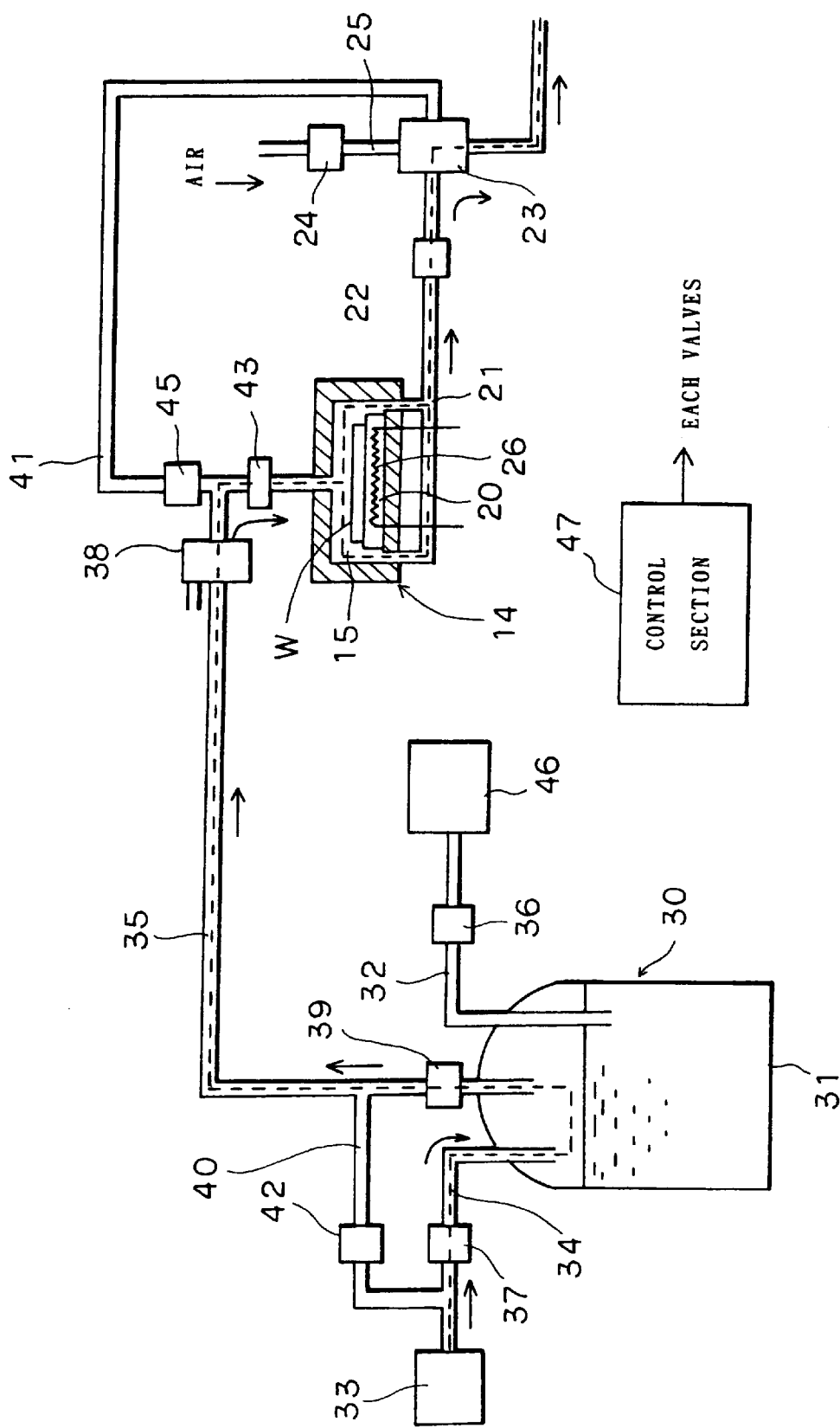
FIG. 5 is a view showing the flow of HMDS vapor or mist and of a transfer gas when supplying processing solution.

Next, by opening the valves 39, 38 and 43 equipped in the supply pipe 35, the HMDS vapor or mist is supplied along with the transfer gas into the process chamber 15 through the supply pipe 35. As a result, the HMDS vapor or mist and the transfer gas flow as shown by the dotted line in FIG. 5, and the predetermined hydrophobic process is applied to a wafer W in the processing chamber 15.

Now, at time of such hydrophobic process, the inside of the supply pipe 35 is filled with HMDS air. Therefore, when the processing solution supplying apparatus 30 stops working for a long time for reasons such as an emergency stop, HMDS may exist inside the supply 35 in a large-sized mist. When the hydrophobic process is restarted from this condition, this large-sized HMDS mist will be supplied to a wafer W in the process chamber 15. As a result, HMDS vapor or mist may not be supplied uniformly on the surface of a wafer W.

In the embodiment of the present invention, when restarting the hydrophobic process on a wafer W after a prolonged stoppage of the processing solution supplying apparatus, only the transfer gas is supplied to the supply pipe 35 before performing a wafer W's hydrophobic process, enabling the air in the supply pipe 35 to be exhausted through a branched exhaustion pipe 41 bypassing the process chamber 15.

Figure 6:
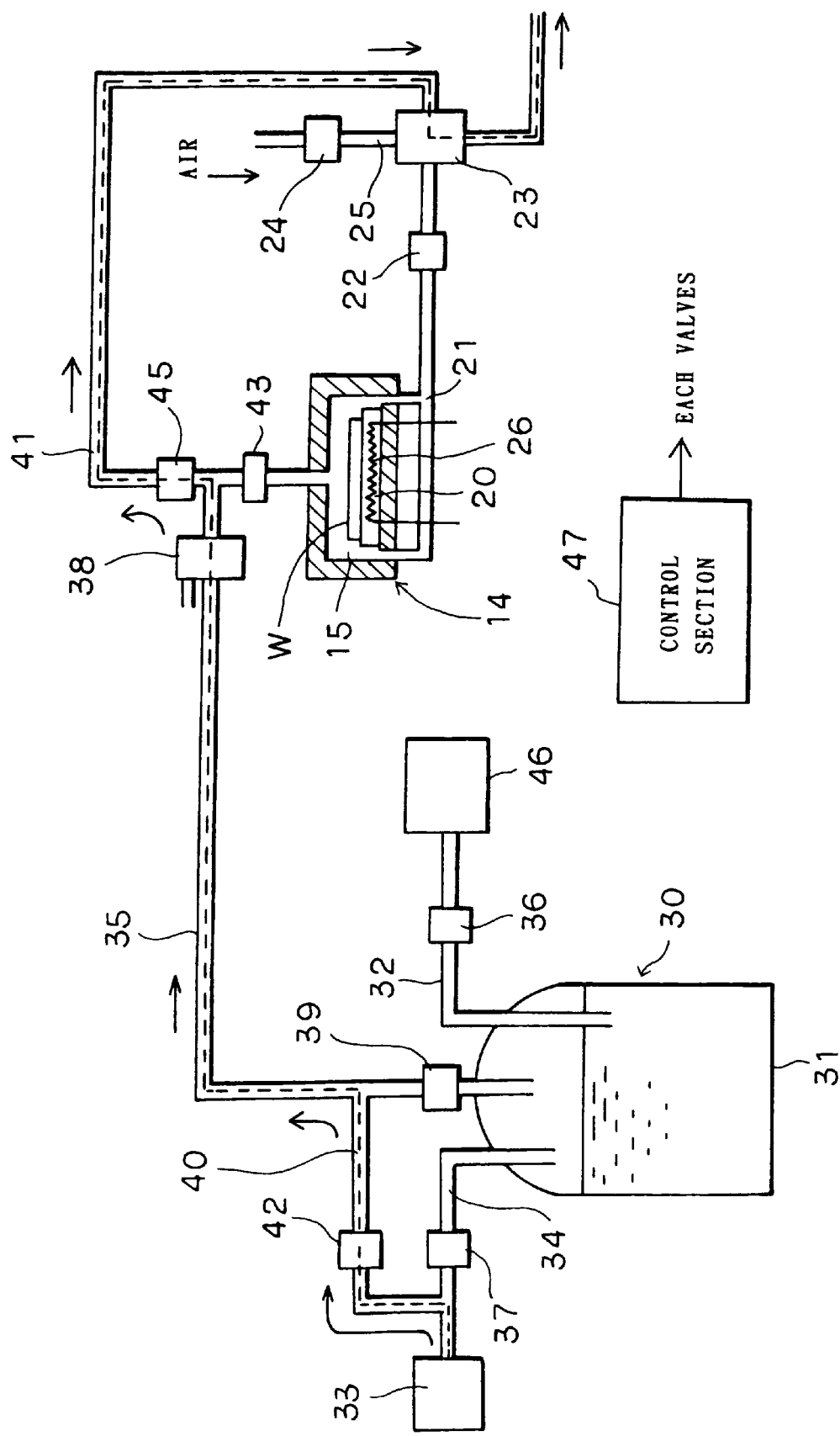
FIG. 6 is a view showing the flow of HMDS vapor or mist and of a transfer gas when bypassing.

In other words, as shown in FIG. 4, by closing the valves 43, 37, 39 and 22 and opening the valves 42, 38, 45 and 24, the air in the supply pipe 35 can be exhausted through the branched exhaustion pipe 41 without sending it into the process chamber 15. Thereby, through a passage shown by the dotted line in FIG.6, the transfer gas and the large-sized HMDS mist in the supply pipe 35 are exhausted outside, and the supply pipe 35 is filled only with the transfer gas.

Afterwards, as shown in FIG. 3, valves 42 and 45 are closed, valves 22, 37, 39 and 43 are opened, and the hydrophobic process can be started again. Thus, the large-sized HMDS mist does not go inside the process chamber 15 immediately after restarting, and the appointed hydrophobic process is possible.

Still less, it may be applied that the first HMDS vapor or mist is supplied to a dummy wafer, and the predetermined hydrophobic process is restarted after its composition is confirmed.

After that, the wafer W with the predetermined hydrophobic process finished, is held again by the main transfer apparatus 3 and transferred to a cooling apparatus 10 for the next cooling process.

In the embodiment of the present invention, When restarting the hydrophobic process with the processing solution supplying apparatus 30, air ine the supply pipe 35 can be exhausted outside before this hydrophobic process by using a transfer gas bypassing the process chamber 15. Therefore, the large-sized HMDS mist staying in the supply pipe 35 will not be supplied directly to a wafer W, and when the hydrophobic process is restarted after a prolonged stoppage of the adhesion apparatus 14, the HMDS vapor or mist can be supplied uniformly upon a wafer W.

Furthermore, since the transfer gas used for exhausting the large-sizedmist is originally thegas for supplying HMDS, no special purge gas is needed.

Now in this embodiment, the air in the supply pipe 35 is exhausted by an ejector 23 but instead, as shown in FIG. 7, it can be exhausted directly outside through an exhaust pipe 71 from a valve 45.

In the embodiment of the present invention, a wafer W, for example, is used as a substrate for explanation sake, but this invention is not restricted only to such a case and can be applied to cases such as using a LCD substrate.

According to the present invention, when restarting the hydrophobic process after stopping the processing solution supplying apparatus for a long time, a transfer gas is sent through the pipe to exhaust the air in the pipe. Thus, the large-sized vapor or mist of the processing solution immediately after restarting the process is not supplied to the substrate, and the vapor or mist of the processing solution can be supplied uniformly to the substrate. Moreover, no special purge gas is needed.

The aforesaid embodiment has the sole intention of clarifying the technical meaning of the present invention. Therefore, the present invention is not to be limited to the above concrete embodiment or interpreted in a narrow sense. Various changes may be made therein without departing from the spirit of the present invention and within the meaning of the claims.

What is claimed is:

1. An apparatus for supplying a gas including a processing solution to a process chamber, the process chamber performing a predetermined process to a processed object, the apparatus comprising:
   a tank that stores the processing solution;
   a transfer gas supply for the transfer of gas to the tank;
   a supply pipe disposed between the tank and the processing chamber and supplying the transfer gas including the processing solution to the processing chamber;
   a branched supply pipe connected at one end to the supply pipe and at the other end of the transfer gas supply source; and
   a cleaner that causes the transfer gas, as a cleaning gas, to directly pass from the branched supply pipe through the supply pipe and discharges the cleaning gas just before the process chamber.

2. The apparatus according to claim 1, wherein the supply pipe supplies the transfer gas including a vapor of the processing solution.

3. The apparatus according to claim 2, wherein the transfer gas is nitrogen gas.

4. The apparatus according to claim 1, wherein the supply pipe supplies the transfer gas including a mist of the processing solution.

5. The apparatus according to claim 1, wherein the apparatus further comprises:
   an exhaust pipe connected to the process chamber, that exhausts an air inside the process chamber; and
   an exhauster that exhausts the process chamber with the exhaust pipe;
   wherein the cleaner further comprises:
      a branched exhaust pipe connected to the supply pipe just before the process chamber and exhausted by the exhauster;
         wherein the exhauster exhausts the cleaning gas coming through the supply pipe wit the branched exhaustion pipe.

6. The apparatus according to claim 1, wherein the processing solution is Hexamethyldisilazane.

7. A processing apparatus comprising:
   a process chamber wherein a predetermined process to a processed object using a gas including a processing solution is performed; the apparatus comprising:
   a tank that stores the processing solution;
   a transfer gas supply source that supplies the transfer gas to the tank;
   a supply pipe disposed between the tank and the processing chamber and supplies the transfer gas including the processing solution to the processing chamber;
   a branched supply pipe connected at one end to the supply pipe and at the other end to the transfer gas supply source; and
   a cleaner that causes the transfer gas, as a cleaning gas, to directly pass from the branched supply pipe through the supply pipe and discharges the cleaning gas just before the process chamber.

8. An apparatus which supplies a gas including a processing solution to a process chamber for performing a predetermined process to a processed object, comprising:
   a source that outputs a transfer gas;
   a tank that stores the processing solution, takes in the transfer gas output from the source, and sends out the transfer gas including the processing solution;
   a supply pipe disposed between the tank and the process chamber, that supplies the transfer gas including the processing solution to the process chamber;
   a bypass pipe that connects the transfer gas supply source with the supply pipe;
   a first valve disposed between the transfer gas supply source and the tank;
   a second valve disposed between the tank and the supply pipe;
   a third valve disposed at the bypass pipe;
   an exhauster disposed between the supply pipe and the process chamber and that exhausts the transfer gas that passes through the supply pipe at the time of cleaning just before the process chamber; and
   a control section that opens the first and second valves and closes the third valve at the time of the predetermined process to the processed object, and closes the first and second valves and opens the third valve at the time of cleaning.

9. A processing method comprising the steps of:
   (a) supplying a transfer gas including a processing solution to a process chamber from a tank storing the processing solution through a supply pipe, by supplying the transfer gas from a transfer gas supply source to the tank;
   (b) performing a predetermined process to a processed object in the process chamber using the transfer gas including the processing solution; and
   (c) causing the transfer gas, as a cleaning gas, to directly flow from the transfer gas supply source into the supply pipe and to pass through the supply pipe, and exhausting the transfer gas just before the process chamber.

10. The method according to claim 9, wherein the step (c) is performed after the termination of the steps (a) and (b), and before starting the steps (a) and (b).

* * * * *